United States Patent
Huh et al.

(10) Patent No.: US 9,184,180 B2
(45) Date of Patent: Nov. 10, 2015

(54) FLEXIBLE DISPLAY APPARATUS AND METHOD OF MANUFACTURING SAME

(71) Applicant: SAMSUNG DISPLAY CO., LTD., Yongin, Gyeonggi-Do (KR)

(72) Inventors: Myung-Soo Huh, Yongin (KR); Sung-Chul Kim, Yongin (KR); Suk-Won Jung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/162,465

(22) Filed: Jan. 23, 2014

(65) Prior Publication Data

US 2015/0021631 A1  Jan. 22, 2015

(30) Foreign Application Priority Data

Jul. 16, 2013  (KR) .......................... 10-2013-0083577

(51) Int. Cl.
*H01L 27/12* (2006.01)
*H01L 29/786* (2006.01)

(52) U.S. Cl.
CPC ........ *H01L 27/1218* (2013.01); *H01L 27/1266* (2013.01); *H01L 29/78603* (2013.01); *H01L 29/78684* (2013.01)

(58) Field of Classification Search
CPC .......................... H01L 27/1218; H01L 27/1266
See application file for complete search history.

(56) References Cited

U.S. PATENT DOCUMENTS

| | | | |
|---|---|---|---|
| 5,397,713 A * | 3/1995 | Hamamoto et al. | 438/97 |
| 7,141,348 B2 | 11/2006 | Sheats et al. | |
| 2007/0009827 A1 | 1/2007 | Sheats et al. | |
| 2007/0210420 A1 | 9/2007 | Nelson et al. | |
| 2009/0169819 A1* | 7/2009 | Drzaic et al. | 428/156 |
| 2011/0101365 A1 | 5/2011 | Kim et al. | |
| 2011/0195239 A1* | 8/2011 | Takane et al. | 428/206 |
| 2012/0141799 A1* | 6/2012 | Kub et al. | 428/408 |
| 2012/0171108 A1* | 7/2012 | Kim et al. | 423/448 |
| 2012/0208027 A1* | 8/2012 | Robinson et al. | 428/408 |
| 2014/0008657 A1* | 1/2014 | Lu et al. | 257/59 |
| 2014/0220764 A1* | 8/2014 | Bayram et al. | 438/458 |
| 2014/0308517 A1* | 10/2014 | Zhamu et al. | 428/367 |
| 2014/0342127 A1* | 11/2014 | Dimitrakopoulos et al. | 428/172 |

FOREIGN PATENT DOCUMENTS

| | | | |
|---|---|---|---|
| KR | 10-2011-0047454 A | 5/2011 | |
| KR | 10-1093133 B1 | 12/2011 | |
| KR | 10-1188988 B1 | 10/2012 | |
| KR | 10-1206352 B1 | 11/2012 | |

* cited by examiner

*Primary Examiner* — Khaja Ahmad
(74) *Attorney, Agent, or Firm* — Christie, Parker & Hale, LLP

(57) ABSTRACT

A method of manufacturing a flexible display apparatus includes: preparing a support substrate; forming a first graphene oxide layer having a first electrical charge on the support substrate; forming a second graphene oxide layer having a second electrical charge on the first graphene oxide layer; forming a flexible substrate on the second graphene oxide layer; forming a display unit on the flexible substrate; and separating the support substrate and the flexible substrate from each other.

20 Claims, 8 Drawing Sheets

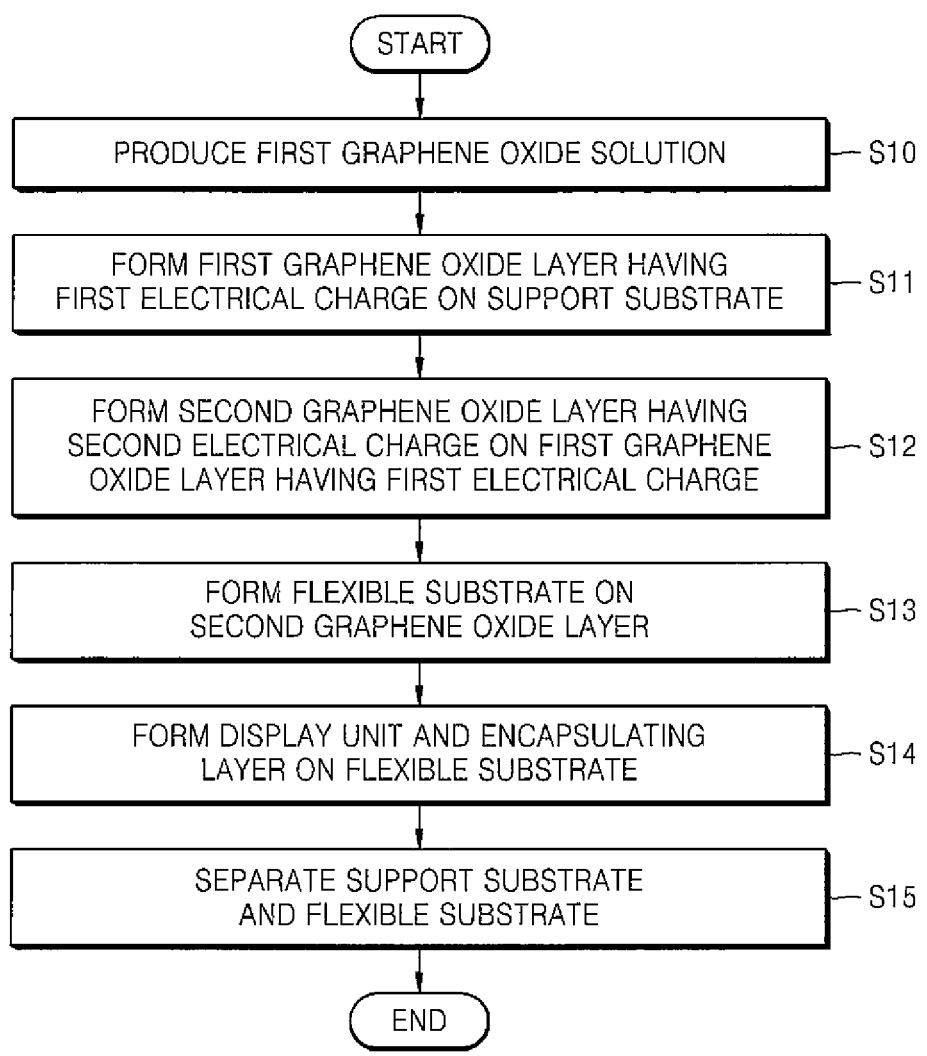

FLEXIBLE DISPLAY APPARATUS AND METHOD OF MANUFACTURING SAME

CROSS-REFERENCE TO RELATED APPLICATION

This application claims priority to and the benefit of Korean Patent Application No. 10-2013-0083577, filed on Jul. 16, 2013, in the Korean Intellectual Property Office, the content of which is incorporated herein in its entirety by reference.

BACKGROUND

1. Field

One or more embodiments of the present invention relate to a method of manufacturing a flexible display apparatus.

2. Description of the Related Art

Liquid crystal display apparatuses, organic light-emitting display apparatuses, and the like formed with a thin film transistor have gained increasing market share as displays for mobile devices, such as digital cameras, video cameras, personal digital assistants (PDAs), cellular phones, or the like.

Such displays for mobile devices needs to be thin, light, and flexible enough to be curved, so as to be easy to carry and be easily applied to various shapes of display apparatuses. To this end (currently), a method for performing a process of separating a support substrate and a flexible substrate from each other after mounting the flexible substrate on the support substrate has been introduced.

However, in a process of using a laser to separate the support substrate from the flexible substrate, as used in a comparable method, the separation may not be uniformly performed since energy is not uniformly emitted (distributed), or a flexible display apparatus may be deteriorated due to the excessive emission of energy.

SUMMARY

Aspects of one or more embodiments of the present invention relate to a method of manufacturing a flexible display apparatus, whereby a support substrate and a flexible substrate are easily separated from each other.

Additional aspects will be set forth in part in the description which follows and, in part, will be apparent from the description, or may be learned by practice of the presented embodiments.

According to one or more embodiments of the present invention, a method of manufacturing a flexible display apparatus includes: preparing a support substrate; forming a first graphene oxide layer having a first electrical charge on the support substrate; forming a second graphene oxide layer having a second electrical charge on the first graphene oxide layer; forming a flexible substrate on the second graphene oxide layer; forming a display unit on the flexible substrate; and separating the support substrate and the flexible substrate from each other.

The support substrate may include a glass substrate, a polymer film, or a silicon wafer.

The forming of the first graphene oxide layer having the first electrical charge on the support substrate may include: coating a first graphene oxide solution having the first electrical charge on the support substrate; and drying the support substrate on which the first graphene oxide solution is coated.

The coating of the first graphene oxide solution on the support substrate may be performed using any one selected from dip coating, spray coating, spin coating, screen coating, offset printing, inkjet printing, pad printing, knife coating, kiss coating, gravure coating, painting with a brush, ultrasound fine spray coating, and spray-mist coating.

The method may further include rinsing the support substrate on which the first graphene oxide solution is coated by using de-ionized (DI) water after the coating of the first graphene oxide solution having the first electrical charge on the support substrate and before the drying of the support substrate on which the first graphene oxide solution is coated.

The forming of the second graphene oxide layer having the second electrical charge on the first graphene oxide layer may include: preparing a second graphene oxide solution having the second electrical charge; coating the second graphene oxide solution on the first graphene oxide layer; and drying the first graphene oxide layer on which the second graphene oxide solution is coated.

The coating of the second graphene oxide solution on the first graphene oxide layer may be performed using any one selected from among dip coating, spray coating, spin coating, screen coating, offset printing, inkjet printing, pad printing, knife coating, kiss coating, gravure coating, painting with a brush, ultrasound fine spray coating, and spray-mist coating.

The method may further include rinsing the support substrate on which the first graphene oxide solution is coated by using DI water after the coating of the second graphene oxide solution on the first graphene oxide layer and before the drying of the first graphene oxide layer on which the second graphene oxide solution is coated.

The second graphene oxide solution having the second electrical charge may be formed by pouring a sulfuric acid solution into the first graphene oxide solution having the first electrical charge, wherein the first electrical charge is a negative charge, and the second electrical charge is a positive charge.

The method may further include immersing the support substrate into a polymer electrolyte after the preparing of the support substrate and before the forming of the first graphene oxide layer having the first electrical charge on the support substrate, so that the surface of the support substrate has the second electrical charge.

The first electrical charge may be a negative charge, the second electrical charge may be a positive charge, and the polymer electrolyte may be a positive-ionic polymer electrolyte.

The positive-ionic polymer electrolyte may include poly(allyamine)hydrochloride (PAH), polydiallyldimethylammonium (PDDA), or poly(ethyleneimine) (PEI).

The first electrical charge may be a positive charge, the second electrical charge may be a negative charge, and the polymer electrolyte may be a negative-ionic polymer electrolyte.

The negative-ionic polymer electrolyte may include poly(4-styrenesulfonate) (PSS) or poly(acrylic)acid (PAA).

The separating of the support substrate and the flexible substrate may include separating the first graphene oxide layer and the second graphene oxide layer from each other.

The flexible substrate may be formed of a material selected from polyester, polyvinyl, polycarbonate, polyethylene, polyacetate, polyimide, polyethersulphone (PES), polyacrylate (PAR), polyethylenenaphthalate (PEN), and polyethyleneterephthalate (PET).

The separating of the support substrate and the flexible substrate may include separating the support substrate and the flexible substrate from each other by using a peeling force.

The first graphene oxide layer having the first electrical charge and the second graphene oxide layer having the second electrical charge may be bonded to each other by the Van der Waals force.

The method may further include forming an encapsulating layer on the display unit after the forming of the display unit on the flexible substrate and before the separating of the support substrate and the flexible substrate.

According to one or more embodiments of the present invention, a method of manufacturing a flexible display apparatus includes: preparing a support substrate; forming a graphene oxide layer by alternately stacking a first graphene oxide layer having a first electrical charge and a second graphene oxide layer having a second electrical charge on the support substrate; forming a flexible substrate on the graphene oxide layer; sequentially forming a display unit and an encapsulating layer on the flexible substrate; and separating the support substrate and the flexible substrate from each other.

The method may further include immersing the support substrate into a polymer electrolyte having the second electrical charge after the preparing of the support substrate and before the forming of the graphene oxide layer, so that the surface of the support substrate has the second electrical charge.

The first electrical charge may be a negative charge, the second electrical charge may be a positive charge, and the polymer electrolyte may be a positive-ionic polymer electrolyte.

The positive-ionic polymer electrolyte may include poly(allyamine)hydrochloride (PAH), polydiallyldimethylammonium (PDDA), or poly(ethyleneimine) (PEI).

The first electrical charge may be a positive charge, the second electrical charge may be a negative charge, and the polymer electrolyte may be a negative-ionic polymer electrolyte.

The negative-ionic polymer electrolyte may include poly(4-styrenesulfonate) (PSS) or poly(acrylic)acid (PAA).

According to one or more embodiments of the present invention, a flexible display apparatus includes: a flexible substrate; a graphene oxide layer having an electrical charge on the lower surface of the flexible substrate; a display unit on an upper surface of the flexible substrate; and an encapsulating layer covering the display unit.

The graphene oxide layer having an electrical charge may be a single graphene oxide layer having a first electrical charge or a second electrical charge.

The graphene oxide layer having the electrical charge may include a first graphene oxide layer having the first electrical charge or a second graphene oxide layer having the second electrical charge. In one embodiment, the graphene oxide layer having the electrical charge may include one or more of the first graphene oxide layers each having the first electrical charge and one or more of the second graphene oxide layers each having the second electrical charge, the first graphene oxide layers being each alternatively formed with a corresponding one of the second graphene oxide layers.

The display unit may include: a pixel circuit layer on the upper surface of the flexible substrate and including a plurality of driving thin film transistors; and an emission layer on the pixel circuit layer and including a plurality of organic light-emitting devices.

The flexible substrate may be formed of a material selected from polyester, polyvinyl, polycarbonate, polyethylene, polyacetate, polyimide, polyethersulphone (PES), polyacrylate (PAR), polyethylenenaphthalate (PEN), and polyethyleneterephthalate (PET).

The encapsulating layer may be formed by alternately stacking an inorganic film and an organic film.

BRIEF DESCRIPTION OF THE DRAWINGS

These and/or other aspects will become apparent and more readily appreciated from the following description of the embodiments, taken in conjunction with the accompanying drawings in which:

FIG. 1 is a flowchart illustrating a manufacturing process of forming a flexible display apparatus by using a graphene oxide, according to an embodiment of the present invention;

DETAILED DESCRIPTION

Figure 2A:
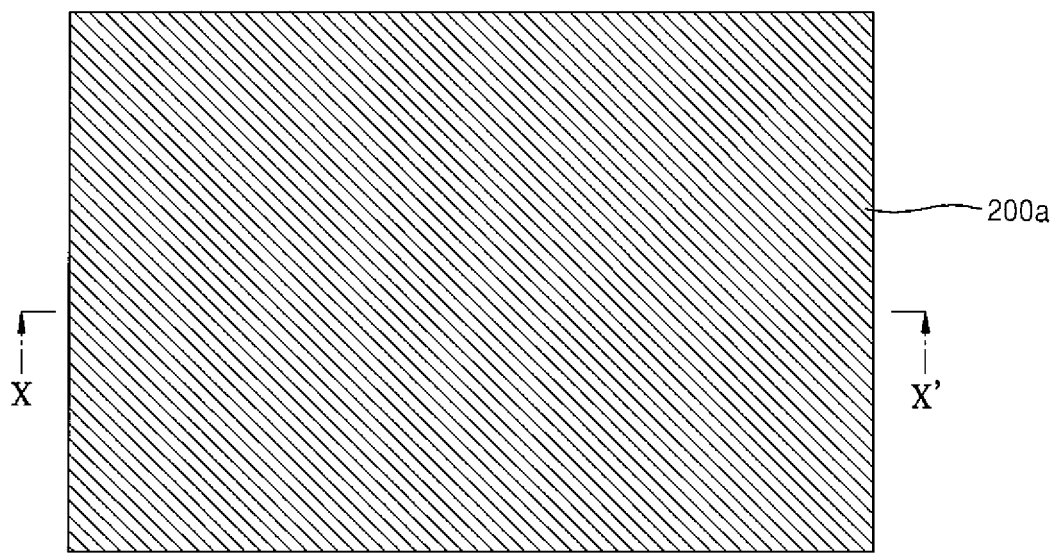
FIGS. 2A, 3A, 4A, 5A, 6A, and 7A are top views for describing (illustrating) the manufacturing process of forming a flexible display apparatus by using a graphene oxide, according to an embodiment of the present invention.

Reference will now be made in more detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. In the following description, known functions or constructions are not described in more detail so as not to obscure the invention with unnecessary detail.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components. It will be understood that when a layer, region, or component is referred to as being "formed on," an other layer, region, or component, it can be directly or indirectly formed on the other layer, region, or component. That is, for example, intervening layers, regions, or components may be present.

The configurations and the operations of the present invention will now be described in more detail with reference to the accompanying drawings, in which example embodiments of the invention are shown.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

FIG. 1 is a flowchart illustrating a manufacturing process of forming a flexible display apparatus by using a graphene oxide, according to an embodiment of the present invention, and FIGS. 2A, 3A, 4A, 5A, 6A, and 7A are top views and cross-sectional views for describing the manufacturing process of forming a flexible display apparatus by using a graphene oxide, according to an embodiment of the present invention, wherein FIGS. 2B, 3B, 4B, 5B, 6B, and 7B are the cross-sectional views along the line X-X' of FIGS. 2A, 3A, 4A, 5A, 6A, and 7A that are the respective top views thereof. The current embodiment will be described with reference to both the top views and the cross-sectional views based on the flowchart.

According to a technical idea of the present invention, a support substrate and a flexible substrate may be easily separated from each other without irradiation of a laser in a process of forming the flexible display apparatus by using a graphene oxide.

Referring to FIG. 1, in operation S10, a first graphene oxide solution is produced. In this operation, the first graphene oxide solution in a liquid phase is first produced, for example, using pre-graphene or mechanically grinded graphene. The produced first graphene oxide solution has a reddish brown color or a yellowish brown color.

Various methods are known to those of ordinary skill in the art as suitable methods of producing the first graphene oxide solution, and the first graphene oxide solution produced in all the suitable methods may be used in one or more embodiments of the present invention. For example, the pre-graphene or mechanically grinded graphene and sodium nitrate ($NaNO_3$) are poured (added) into a sulfuric acid ($H_2SO_4$) solution, and potassium manganese oxide ($KMnO_4$) (or potassium chlorate) is slowly poured (added) therein while cooling the $H_2SO_4$ solution including the pre-graphene or mechanically grinded graphene and $NaNO_3$.

Next, additional sulfuric acid ($H_2SO_4$) is slowly poured into the solution including the potassium manganese oxide ($KMnO_4$) (or potassium chlorate), and hydrogen peroxide ($H_2O_2$) is poured into the solution therein.

Next, centrifugation therefor is performed, an upper solution is poured away (discarded), and the remaining (residue) is washed with $H_2SO_4/H_2O_2$ and finally washed with water. By repeating these procedures, a reddish brown and thick first graphene oxide solution (in a slightly gel state) is obtained. In the procedures, $Mn3+$, $Mn4+$, $MnO_2$, $KMnO_4$, $HNO_3$, $HNO_4$, $CrO_3$, or the like may be usable as a chemical oxidizer. However, the technical idea of the present invention is not limited thereto.

The first graphene oxide solution produced in the method described above has a first electrical charge, and to improve a characteristic of the first electrical charge, the first graphene oxide solution may further include metal nanowires or metal nanoparticles. For example, silver, (Ag), copper (Cu), gold (Au), or the like may be included. The metal nanowires or metal nanoparticles may be added as 50 wt % or less to the first graphene oxide solution for transparency and coating line (coatability).

Next, the first graphene oxide solution having the first electrical charge is coated on the surface of a support substrate 100 by immersing the support substrate 100 into the first graphene oxide solution. As a suitable method of coating the first graphene oxide solution on the surface of the support substrate 100, any one method selected from among dip coating, spray coating, spin coating, screen coating, offset printing, inkjet printing, pad printing, knife coating, kiss coating, gravure coating, painting with a brush, ultrasound fine spray coating, and spray-mist coating may be used. However, the technical idea of the present invention is not limited thereto.

Figure 2B:
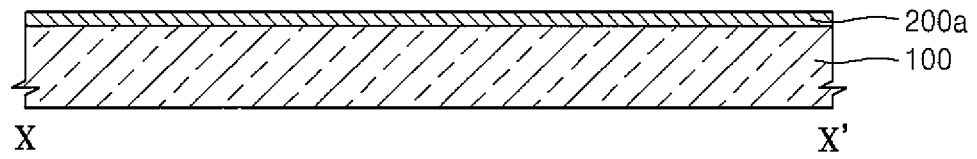
FIGS. 2B, 3B, 4B, 5B, 6B, and 7B are cross-sectional views for describing (illustrating) the manufacturing process of forming a flexible display apparatus by using a graphene oxide, according to an embodiment of the present invention.

Referring to FIGS. 1, 2A, and 2B, in operation S11, a first graphene oxide layer 200a having the first electrical charge is formed on the support substrate 100 by performing a process of drying the first graphene oxide solution coated on the surface of the support substrate 100. The drying process may be performed for about one hour at a temperature of about 80° C.

Before performing the drying process, a process of rinsing the support substrate 100 on which the first graphene oxide solution is coated may be additionally performed using deionized (DI) water.

The support substrate 100 is a substrate that supports a flexible substrate (300 of FIG. 4B) and may include a glass substrate, a polymer film, or a silicon wafer. However, the technical idea of the present invention is not limited thereto, and any suitable material having an electrical charge is usable.

A process of processing (treating) the surface of the support substrate 100 to have the hydrophilic property or have a second electrical charge (with opposite polarity to the first charge) may be additionally performed to make it easier to form the first graphene oxide layer 200a having the first electrical charge on the support substrate 100.

The support substrate 100 may be washed with $H_2SO_4/H_2O_2$ so that the surface of the support substrate 100 is converted into a hydrophilic state.

Alternatively, the surface of the support substrate 100 may have the second electrical charge by immersing the support substrate 100 into a polymer electrolyte (solution) having the second electrical charge. When the support substrate 100 having the second electrical charge is immersed into the first graphene oxide solution having the first electrical charge, the first graphene oxide layer 200a may be more easily formed on the surface of the support substrate 100. When the first electrical charge is a negative charge, the second electrical charge is then a positive charge, and the polymer electrolyte having the second electrical charge, i.e., a positive-ionic polymer electrolyte, may include poly(allyamine)hydrochloride (PAH), polydiallyldimethylammonium (PDDA), or poly(ethyleneimine) (PEI). However, the technical idea of the present invention is not limited thereto.

As a method of processing the surface of the support substrate 100 to have the second electrical charge, besides dip coating in which the support substrate 100 is immersed into a polymer electrolyte having the second electrical charge, any one method selected from among spray coating, spin coating, screen coating, offset printing, inkjet printing, pad printing, knife coating, kiss coating, gravure coating, painting with a brush, ultrasound fine spray coating, and spray-mist coating may be used.

Figure 3A:
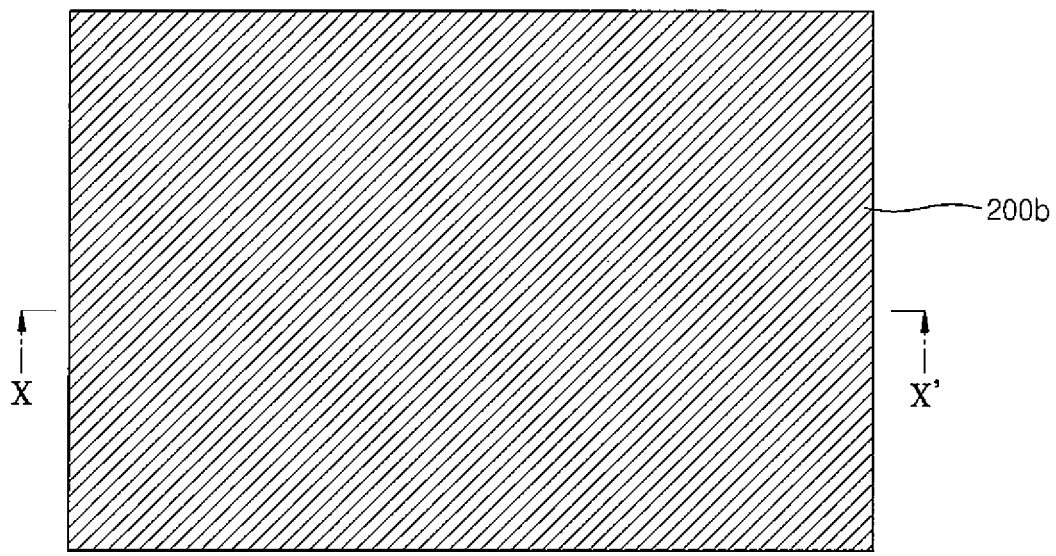
Figure 3B:
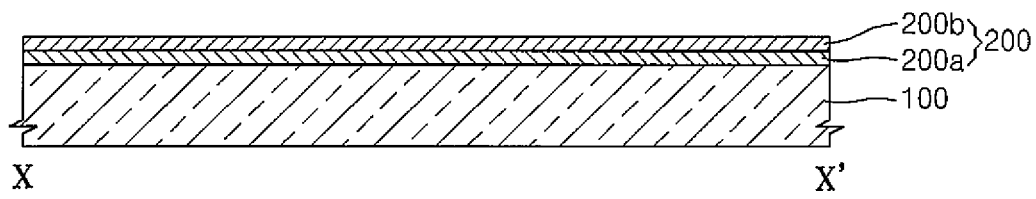

Referring to FIGS. 1, 3A, and 3B, in operation S12, a second graphene oxide layer 200b having the second electrical charge is formed on the first graphene oxide layer 200a having the first electrical charge. The first and second graphene oxide layers 200a and 200b having different electrical charges form a graphene oxide layer 200 on the support substrate 100.

To form the second graphene oxide layer 200b on the first graphene oxide layer 200a, a second graphene oxide solution is coated on the first graphene oxide layer 200a. In more detail, the support substrate 100 on which the first graphene oxide layer 200a is formed is immersed into the second graphene oxide solution having the second electrical charge. As a method of coating the second graphene oxide solution on the first graphene oxide layer 200a, besides dip coating, any one method selected from among spray coating, spin coating, screen coating, offset printing, inkjet printing, pad printing, knife coating, kiss coating, gravure coating, painting with a brush, ultrasound fine spray coating, and spray-mist coating may be used.

The second graphene oxide layer 200b is formed on the first graphene oxide layer 200a by performing a process of drying the second graphene oxide solution coated on the first graphene oxide layer 200a. The drying process may be performed for about one hour at a temperature of about 80° C.

Before performing the drying process, a process of rinsing the support substrate 100 on which the second graphene oxide solution is coated may be additionally performed using deionized (DI) water.

Since the first graphene oxide solution has the first electrical charge, i.e., a negative charge, a process for forming (preparing) the second graphene oxide solution having the second electrical charge is performed.

Here, the second graphene oxide solution may be formed using various suitable methods known to those of ordinary skill in the art. For example, the second graphene oxide solution may be formed using the first graphene oxide solution.

That is, the second graphene oxide solution having a positive charge may be formed by pouring an $H_2SO_4$ solution, an $HNO_3$ solution, or an HCl solution into the first graphene oxide solution having a negative charge. However, the technical idea of the present invention is not limited thereto, and various other suitable methods for forming the second graphene oxide solution having a positive charge may be used.

In addition, although it has been described that the support substrate 100 is immersed into a polymer electrolyte having the second electrical charge so that the support substrate 100 has the second electrical charge, i.e., a positive charge, the technical idea of the present invention is not limited thereto, and the support substrate 100 may be immersed into a negative-ionic polymer electrolyte so that the support substrate 100 has the first electrical charge, i.e., a negative charge. The negative-ionic polymer electrolyte may include, for example, poly(4-styrenesulfonate) (PSS) or poly(acrylic)acid (PAA). However, the technical idea of the present invention is not limited thereto.

For example, after the support substrate 100 is immersed into a polymer electrolyte having the first electrical charge, the support substrate 100 having the first electrical charge is then immersed into the second graphene oxide solution having the second electrical charge to easily form a graphene oxide layer on the support substrate 100. Thereafter, a drying process may be performed to form a second graphene oxide layer having the second electrical charge on the support substrate 100 having the first electrical charge.

In addition or alternatively, the first graphene oxide layer having the first electrical charge may be formed on the second graphene oxide layer having the second electrical charge for easy stacking.

To form the first graphene oxide layer on the second graphene oxide layer, a drying process is performed after the support substrate 100 is immersed into the first graphene oxide solution. As described above, the graphene oxide layer including the second graphene oxide layer and the first graphene oxide layer having different electrical charges may be formed on the support substrate 100.

Figure 4A:
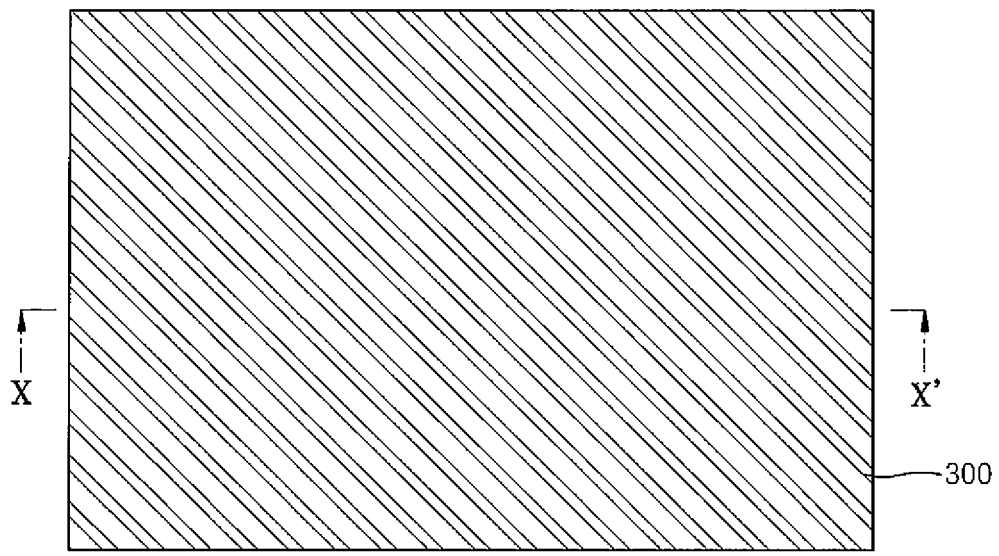
Figure 4B:
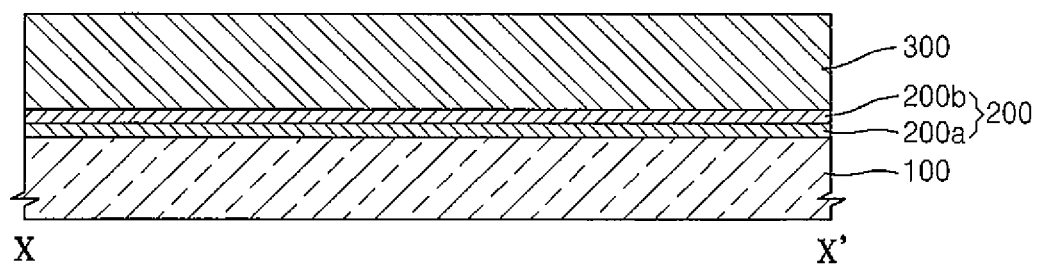

Referring to FIGS. 1, 4A, and 4B, in operation S13, a flexible substrate 300 is formed on the graphene oxide layer 200.

The flexible substrate 300 is a flexible plastic substrate and may be formed of a material selected from polyester, polyvinyl, polycarbonate, polyethylene, polyacetate, polyimide, polyethersulphone (PES), polyacrylate (PAR), polyethylenenaphthalate (PEN), polyethyleneterephthalate (PET), and the like.

The flexible substrate 300 may be formed by coating a polymer material on the graphene oxide layer 200 and hardening the coated polymer material, and the coating method may be any one selected from among spray coating, dip coating, spin coating, screen coating, offset printing, inkjet printing, pad printing, knife coating, kiss coating, gravure coating, painting with a brush, ultrasound fine spray coating, and spray-mist coating. However, the method of forming the flexible substrate 300 on the graphene oxide layer 200 is not limited thereto, and other suitable methods may be used.

Figure 5A:
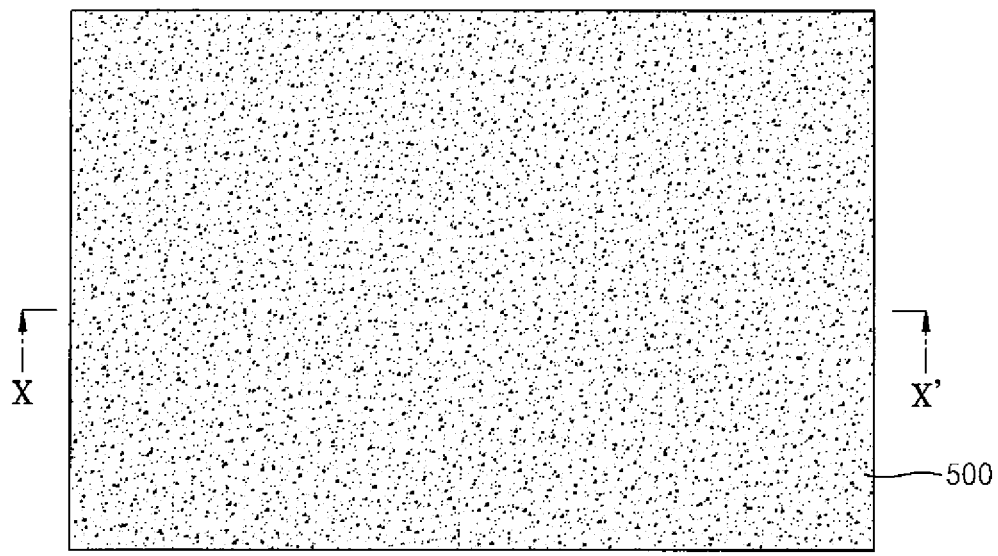
Figure 5B:
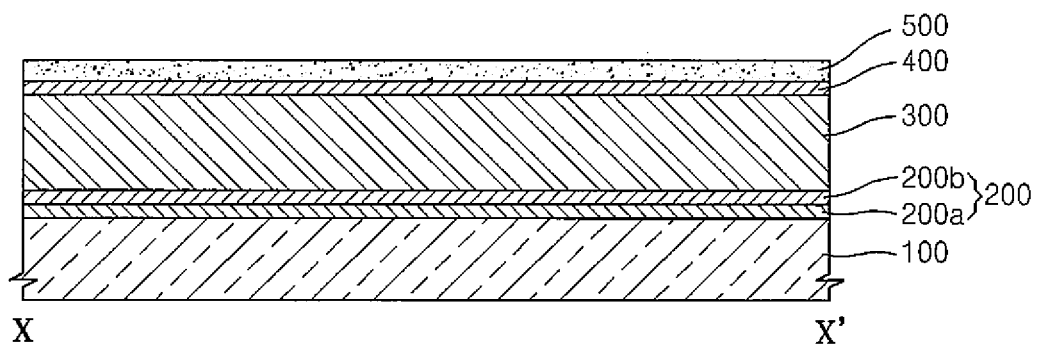

Referring to FIGS. 1, 5A, and 5B, in operation S14, a display unit 400 and an encapsulating layer 500 are sequentially formed on the flexible substrate 300.

The display unit 400 includes a driving thin film transistor unit and a light-emitting unit. The encapsulating layer 500 is formed to cover the display unit 400 to prevent the deterioration of the display unit 400 due to external causes, such as external humidity, oxygen, or the like. The display unit 400 and the encapsulating layer 500 will be described below in more detail with reference to FIG. 8.

Figure 6A:
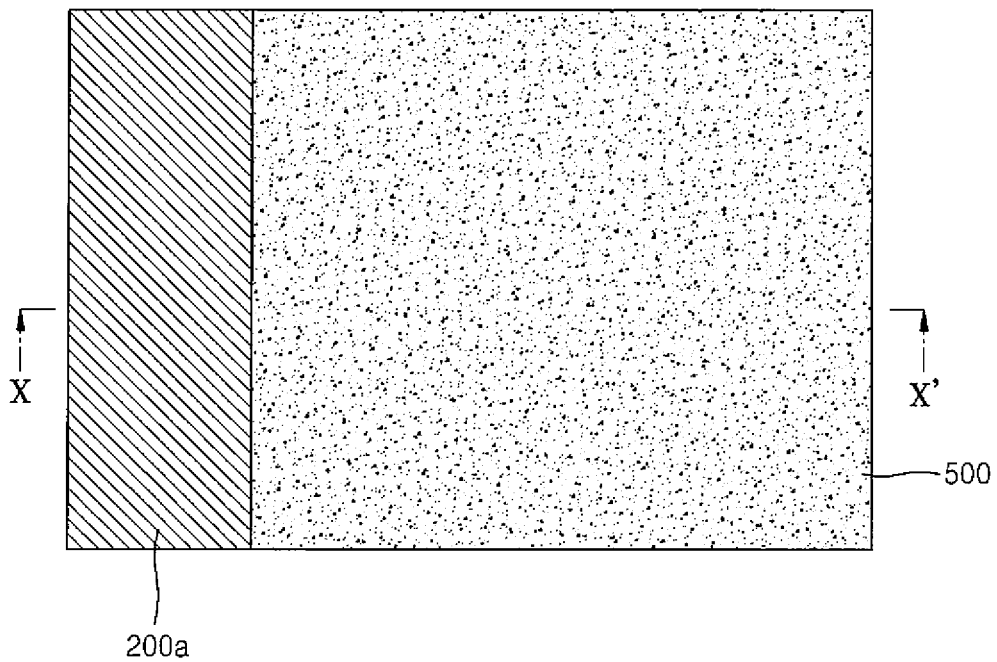
Figure 6B:
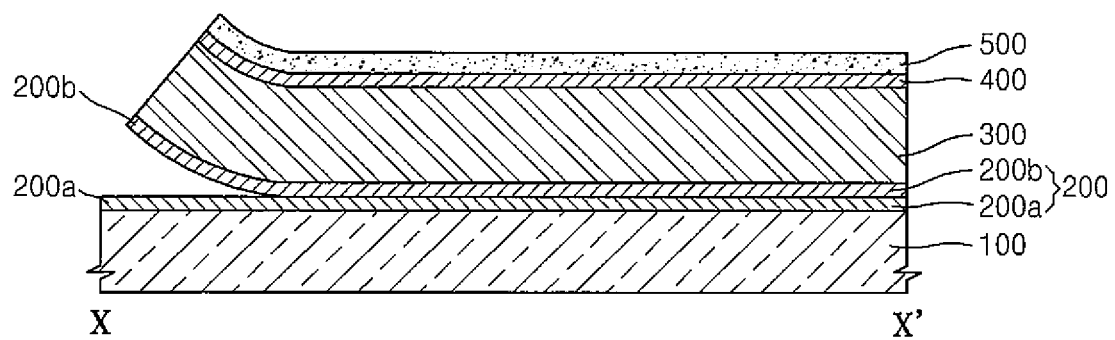

Referring to FIGS. 1, 6A, and 6B, in operation S15, the flexible substrate 300 is separated from the support substrate 100.

The first and second graphene oxide layers 200a and 200b having different electrical charges that are opposite to each other are formed between the support substrate 100 and the flexible substrate 300. Thus, the Van der Waals force that is a weak molecular force acts between the first and second graphene oxide layers 200a and 200b having different electrical charges. In addition, since electrons of a π-π orbit function are widely spread on the surfaces of the first and second graphene oxide layers 200a and 200b, the first and second graphene oxide layers 200a and 200b may have a smooth surface.

Thus, the support substrate 100 and the flexible substrate 300 may be easily separated from each other by using a peeling force, e.g., using a tape on one or both of the support substrate 100 and the flexible substrate 300 to pull (peel) them apart. The second graphene oxide layer 200b may remain on the lower surface of the flexible substrate 300 separated from the support substrate 100, and the first graphene oxide layer 200a may remain on the support substrate 100.

Figure 7A:
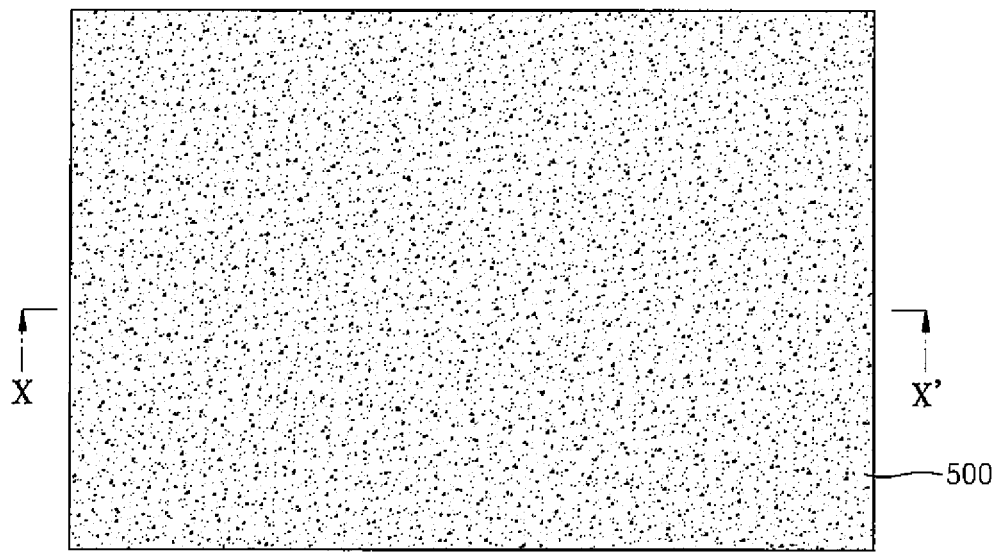
Figure 7B:
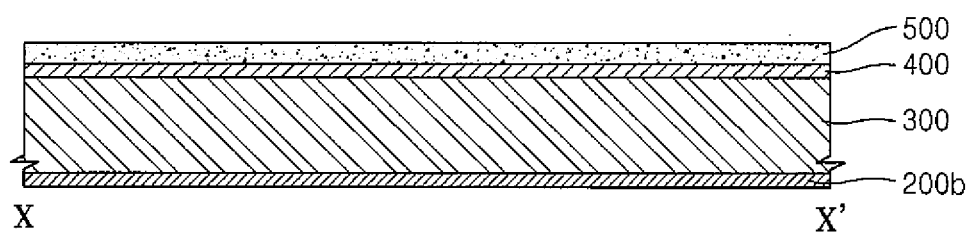

FIGS. 7A and 7B illustrate a flexible display apparatus 10 that is separated from the support substrate 100, according to an embodiment of the present invention.

Referring to FIGS. 7A and 7B, the second graphene oxide layer 200b remains below the flexible substrate 300. Although not shown, both the second graphene oxide layer 200b and the first graphene oxide layer 200a may be separated from the support substrate 100 and may both remain below the flexible substrate 300.

Although it has been described that the first graphene oxide layer 200a having the first electrical charge and the second graphene oxide layer 200b having the second electrical charge are formed between the support substrate 100 and the flexible substrate 300, the technical idea of the present invention is not limited thereto, and a third graphene oxide layer having the first electrical charge may be further formed on the second graphene oxide layer 200b.

When the graphene oxide layer 200 is formed with two layers, i.e., the first graphene oxide layer 200a and the second graphene oxide layer 200b, after a separation process, a single layer (the first graphene oxide layer 200a) or two layers (the first graphene oxide layer 200a and the second graphene oxide layer 200b) may remain on the lower surface of the flexible substrate 300. However, when a graphene oxide layer is formed with three or more graphene oxide layers stacked for every two adjacent layers thereof to have electrical charges that are opposite to each other, types of graphene oxide layers remaining on the lower surface of the flexible substrate 300 may vary.

In addition, since photon energy, such as a laser, is not used for the separation of the support substrate 100 and the flexible substrate 300, problems, such as the deterioration of the flexible substrate 300 due to the laser, may be reduced or prevented to thereby increase the reliability of the flexible display apparatus 10.

Figure 8:
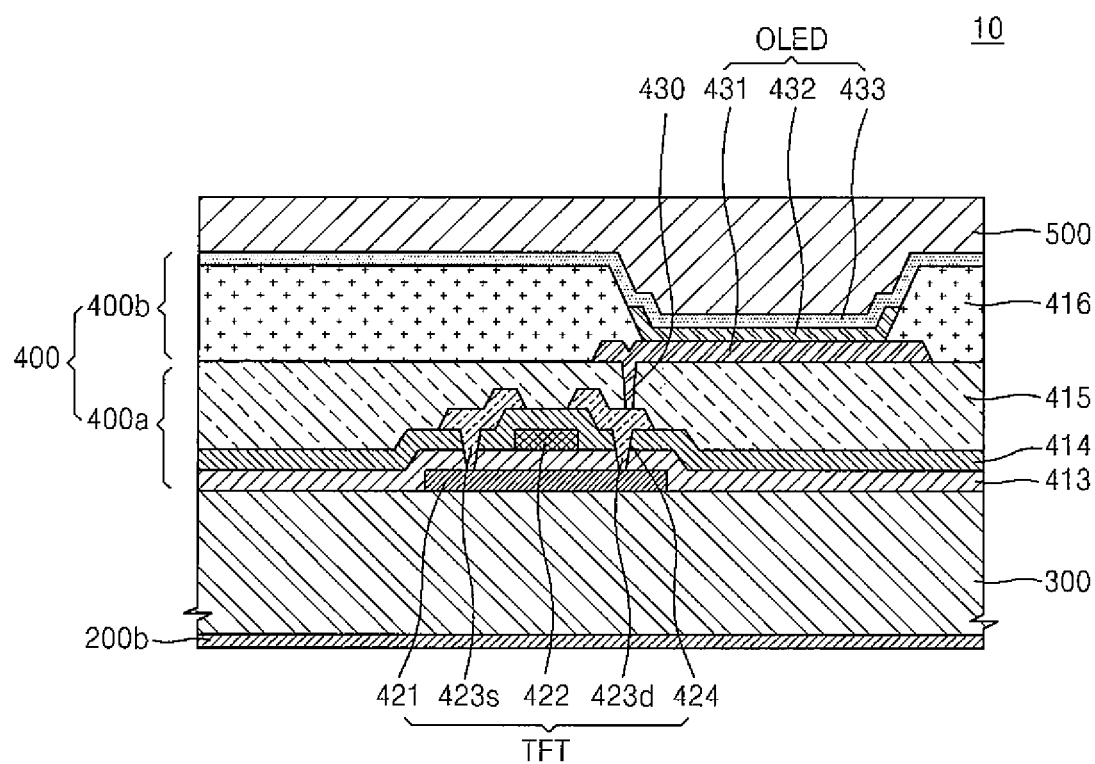
FIG. 8 is a cross-sectional view of a flexible display apparatus according to an embodiment of the present invention.

FIG. 8 is a cross-sectional view of the flexible display apparatus 10 according to an embodiment of the present invention.

Referring to FIG. 8, the display unit 400 may include a pixel circuit layer 400a and an emission layer 400b.

The pixel circuit layer 400a provided on the flexible substrate 300 may include a driving thin film transistor TFT for driving a plurality of organic light-emitting devices OLED formed in the emission layer 400b, a switching thin film transistor, and the like.

When a top-gate driving thin film transistor TFT is provided, a semiconductor layer 421, a gate insulating layer 413, a gate electrode 422, an interlayer insulating layer 414, a contact hole 424, a source electrode 423s, and a drain electrode 423d are sequentially formed on the flexible substrate 300.

The semiconductor layer 421 may be formed of a polysilicon, and in this case, a set or predetermined area may be doped with impurities. Here, the semiconductor layer 421 may be formed of an amorphous silicon instead of the polysilicon or formed of various suitable organic semiconductor materials, such as pentacene.

The driving thin film transistor TFT may include the semiconductor layer 421, the gate electrode 422, the source electrode 423s, and the drain electrode 423d.

A planarization layer (a protective layer and/or a passivation layer) 415 may be further provided on the source and drain electrodes 423s and 423d to protect and planarize the driving thin film transistor TFT.

An organic light-emitting device OLED disposed on the pixel circuit layer 400a and defined by a pixel defining layer 416 may include a pixel electrode 431, an organic emission layer 432 disposed on the pixel electrode 431, and an opposite electrode 433 formed on the organic emission layer 432.

In the current embodiment, the pixel electrode 431 is an anode, and the opposite electrode 433 is a cathode. However, one or more embodiment of the present invention are not limited thereto, and according to a method of driving the flexible display apparatus 10, the pixel electrode 431 may be a cathode, and the opposite electrode 433 may be an anode. When holes and electrons are respectively injected from the pixel electrode 431 and the opposite electrode 433 into the organic emission layer 432 and bonded (combined), light is emitted.

The pixel electrode 431 is electrically connected to the driving thin film transistor TFT formed in the pixel circuit layer 400a.

In the current embodiment, a structure in which the emission layer 400b is disposed on the pixel circuit layer 400a in which the driving thin film transistor TFT is disposed is shown. However, one or more embodiments of the present invention are not limited thereto, and various suitable changes in form are possible, such as a structure in which the pixel electrode 431 in the emission layer 400b is formed in the same layer as the semiconductor layer 421 of the driving thin film transistor TFT, a structure in which the pixel electrode 431 is formed in the same layer as the gate electrode 422, a structure in which the pixel electrode 431 is formed in the same layer as the source electrode 423s and the drain electrode 423d, or the like.

In the current embodiment, the driving thin film transistor TFT has the gate electrode 422 disposed on the semiconductor layer 421. However, one or more embodiments of the present invention are not limited thereto, and the gate electrode 422 may be disposed below the semiconductor layer 421.

The pixel electrode 431 included in the organic light-emitting device OLED according to the current embodiment may include a reflective electrode and include silver (Ag), magnesium (Mg), aluminum (Al), platinum (Pt), palladium (Pd), gold (Au), nickel (Ni), neodymium (Nd), iridium (Ir), chromium (Cr), or a compound thereof. In addition, the pixel electrode 431 may include a transparent or translucent electrode layer.

The transparent or translucent electrode layer may include at least one selected from among indium tin oxide (ITO), indium zinc oxide (IZO), zinc oxide (ZnO), indium oxide ($In_2O_3$), indium gallium oxide (IGO) and aluminum zinc oxide (AZO).

The opposite electrode 433 disposed to face the pixel electrode 431 may be a transparent or translucent electrode and may be formed of a metal thin film having a small (low) work function, including lithium (Li), calcium (Ca), lithium fluoride (LiF)/Ca, LiF/Al, Al, Ag, Mg, or a compound thereof. In addition, an auxiliary electrode layer or a bus electrode may be further formed of a material for forming a transparent electrode, such as an ITO, an IZO, an $In_2O_3$, or the like.

The organic emission layer 432 is disposed between the pixel electrode 431 and the opposite electrode 433 and may be formed of a low-molecular weight organic material or a high-molecular weight organic material.

Besides the organic emission layer 432, an intermediate layer having a hole transport layer (HTL), a hole injection layer (HIL), an electron transport layer (ETL), an electron injection layer (EIL), or the like may be selectively disposed.

Light emitted by the organic emission layer 432 may be directly emitted towards the opposite electrode 433 or be reflected by the pixel electrode 431 including a reflective electrode and then emitted towards the opposite electrode 433 as a top emission display device.

However, the flexible display apparatus 10 according to one or more embodiments of the present invention is not limited to the top emission display device, and light emitted by the organic emission layer 432 may be emitted towards the flexible substrate 300 as a bottom emission display device. Here, the pixel electrode 431 may include a transparent or translucent electrode, and the opposite electrode 433 may include a reflective electrode.

In addition, the flexible display apparatus 10 may be a double-side emission display device to emit light in both directions, i.e., to the top and the bottom.

The encapsulating layer 500 formed to cover the pixel circuit layer 400a may be formed by alternately stacking at least one organic layer and at least one inorganic layer.

The encapsulating layer 500 functions to prevent the infiltration (penetration) of external humidity, oxygen, or the like into the organic light-emitting device (OLED).

Each of the at least one organic layer and the at least one inorganic layer may be plural in number.

The at least one organic layer is formed of a polymer and, for example, may be a single layer or a stacked layer formed of any one of polyethyleneterephthalate (PET), polyimide, polycarbonate, epoxy, polyethylene, and polyacrylate (PAR). In more detail, the at least one organic layer may be formed of PAR including a monomer composite (mixture) including a diacrylate-group monomer and a triacrylate-group monomer, which has been high-molecularized (polymerized). A monoacrylate-group monomer may be further included in the monomer composite (mixture). In addition, a suitable photo initiator, such as thermoplastic polyolefin (TPO), may be further included in the monomer composite (mixture), but one or more embodiments of the present invention are not limited thereto.

The at least one inorganic layer may be a single layer or a stacked layer including a metal oxide or a metal nitride. In more detail, the at least one inorganic layer may include any one of a silicon nitride ($SiN_x$), an aluminum oxide ($Al_2O_3$), a silicon oxide ($SiO_2$), and a titanium oxide ($TiO_2$).

The uppermost layer of the encapsulating layer 500 that is exposed to the outside may be formed as an inorganic layer to prevent the infiltration of humidity into the organic light-emitting device OLED.

The encapsulating layer 500 may include at least one sandwich structure in which at least one organic layer is inserted between at least two inorganic layers. Alternatively, the encapsulating layer 500 may include at least one sandwich structure in which at least one inorganic layer is inserted between at least two organic layers.

The encapsulating layer 500 may sequentially include a first inorganic layer, a first organic layer, and a second inorganic layer from the upper surface of the display unit 400. Alternatively, the encapsulating layer 500 may sequentially include a first inorganic layer, a first organic layer, a second inorganic layer, a second organic layer, and a third inorganic layer from the upper surface of the display unit 400. Alternatively, the encapsulating layer 500 may sequentially include a first inorganic layer, a first organic layer, a second inorganic layer, a second organic layer, a third inorganic layer, a third organic layer, and a fourth inorganic layer from upper surface of the display unit 400.

A halogenated metal layer including LiF may be further included between the display unit 400 and the first inorganic layer. The halogenated metal layer may prevent damage of the display unit 400 when the first inorganic layer is formed in a sputtering method or a plasma deposition method.

The first organic layer is characterized by having a narrower area than the second inorganic layer, and the second organic layer may also have a narrower area than the third inorganic layer. In addition, the first organic layer is characterized by being fully covered by the second inorganic layer, and the second organic layer may also be fully covered by the third inorganic layer.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. A method of manufacturing a flexible display apparatus, the method comprising:
   preparing a support substrate;
   forming a first graphene oxide layer having a first electrical charge utilizing a first graphene oxide solution having the first electrical charge on the support substrate;
   forming a second graphene oxide layer having a second electrical charge utilizing a second graphene oxide solution having the second electrical charge different from the first electrical charge on the first graphene oxide layer;
   forming a flexible substrate on the second graphene oxide layer;
   forming a display unit on the flexible substrate; and
   separating the support substrate and the flexible substrate from each other along a smooth interface between the first graphene oxide layer and the second graphene oxide layer.

2. The method of claim 1, wherein the support substrate comprises a glass substrate, a polymer film, or a silicon wafer.

3. The method of claim 1, wherein the forming of the first graphene oxide layer having the first electrical charge on the support substrate comprises:
   coating the first graphene oxide solution having the first electrical charge on the support substrate; and
   drying the support substrate on which the first graphene oxide solution is coated.

4. The method of claim 3, wherein the coating of the first graphene oxide solution on the support substrate is performed using any one selected from dip coating, spray coating, spin coating, screen coating, offset printing, inkjet printing, pad printing, knife coating, kiss coating, gravure coating, painting with a brush, ultrasound fine spray coating, and spray-mist coating.

5. The method of claim 3, further comprising:
   rinsing the support substrate on which the first graphene oxide solution is coated by using de-ionized (DI) water after the coating of the first graphene oxide solution having the first electrical charge on the support substrate and before the drying of the support substrate on which the first graphene oxide solution is coated.

6. The method of claim 1, wherein the forming of the second graphene oxide layer having the second electrical charge on the first graphene oxide layer comprises: preparing the second graphene oxide solution having the second electrical charge; coating the second graphene oxide solution on the first graphene oxide layer; and drying the first graphene oxide layer on which the second graphene oxide solution is coated.

7. The method of claim 6, wherein the coating of the second graphene oxide solution on the first graphene oxide layer is performed using any one selected from dip coating, spray coating, spin coating, screen coating, offset printing, inkjet printing, pad printing, knife coating, kiss coating, gravure coating, painting with a brush, ultrasound fine spray coating, and spray-mist coating.

8. The method of claim 6, further comprising rinsing the support substrate on which the first graphene oxide solution is coated by using DI water after the coating of the second graphene oxide solution on the first graphene oxide layer and before the drying of the first graphene oxide layer on which the second graphene oxide solution is coated.

9. The method of claim 6, wherein the second graphene oxide solution having the second electrical charge is formed by pouring a sulfuric acid solution into the first graphene oxide solution having the first electrical charge,
   wherein the first electrical charge is a negative charge, and the second electrical charge is a positive charge.

10. The method of claim 1, further comprising:
    immersing the support substrate into a polymer electrolyte after the preparing of the support substrate and before the forming of the first graphene oxide layer having the first electrical charge on the support substrate, so that a surface of the support substrate has the second electrical charge.

11. The method of claim 10, wherein the first electrical charge is a negative charge, the second electrical charge is a positive charge, and the polymer electrolyte is a positive-ionic polymer electrolyte.

12. The method of claim 11, wherein the positive-ionic polymer electrolyte comprises poly(allyamine)hydrochloride (PAH), polydiallyldimethylammonium (PDDA), or poly(ethyleneimine) (PEI).

13. The method of claim 10, wherein the first electrical charge is a positive charge, the second electrical charge is a negative charge, and the polymer electrolyte is a negative-ionic polymer electrolyte.

14. The method of claim 13, wherein the negative-ionic polymer electrolyte comprises poly(4-styrenesulfonate) (PSS) or poly(acrylic)acid (PAA).

15. The method of claim 1, wherein the separating of the support substrate and the flexible substrate comprises separating the first graphene oxide layer and the second graphene oxide layer from each other.

16. The method of claim 1, wherein the flexible substrate is formed of a material selected from the group consisting of polyester, polyvinyl, polycarbonate, polyethylene, polyacetate, polyimide, polyethersulphone (PES), polyacrylate (PAR), polyethylenenaphthalate (PEN), and polyethyleneterephthalate (PET).

17. The method of claim 1, wherein the separating of the support substrate and the flexible substrate comprises separating the support substrate and the flexible substrate from each other by using a peeling force.

18. The method of claim 1, wherein the first graphene oxide layer having the first electrical charge and the second graphene oxide layer having the second electrical charge are bonded to each other by the Van der Waals force.

19. The method of claim 1, further comprising:
    forming an encapsulating layer on the display unit after the forming of the display unit on the flexible substrate and before the separating of the support substrate and the flexible substrate.

20. The method of claim 19, wherein the first graphene oxide layer having the first electrical charge and the second graphene oxide layer having the second electrical charge stacks alternately on the support substrate.

* * * * *